United States Patent
Gates et al.

(10) Patent No.: US 6,617,690 B1
(45) Date of Patent: Sep. 9, 2003

(54) INTERCONNECT STRUCTURES CONTAINING STRESS ADJUSTMENT CAP LAYER

(75) Inventors: Stephen M. Gates, Ossining, NY (US); Timothy J. Dalton, Ridgefield, CT (US); John A. Fitzsimmons, Poughkeepsie, NY (US)

(73) Assignee: IBM Corporation, Armonk, NY (US)

( * ) Notice: Subject to any disclaimer, the term of this patent is extended or adjusted under 35 U.S.C. 154(b) by 0 days.

(21) Appl. No.: 10/218,292

(22) Filed: Aug. 14, 2002

(51) Int. Cl.[7] .................... H01L 29/40; H01L 23/48
(52) U.S. Cl. .................. 257/758; 257/750; 257/751; 257/736; 257/747; 257/759; 257/760
(58) Field of Search ................ 257/758, 750, 257/751, 736, 747, 759, 760

(56) References Cited

U.S. PATENT DOCUMENTS

| | | | |
|---|---|---|---|
| 4,888,247 A | * 12/1989 | Zweben et al. | 428/105 |
| 5,077,115 A | * 12/1991 | Arthur et al. | 428/137 |
| 5,358,775 A | * 10/1994 | Horn, III | 428/209 |
| 5,487,218 A | * 1/1996 | Bhatt et al. | 29/852 |
| 5,552,210 A | * 9/1996 | Horn, III et al. | 428/209 |
| 5,574,630 A | * 11/1996 | Kresge et al. | 361/792 |
| 6,147,009 A | 11/2000 | Grill et al. | |
| 6,368,967 B1 | * 4/2002 | Besser | 438/687 |

OTHER PUBLICATIONS

Goldblatt et al., "A High Performance 0.13$\mu$m Copper BEOL Technology with Low–K–Dielectric", Proceedings of IITC, 2000.

* cited by examiner

Primary Examiner—Jasmine J. B. Clark
(74) Attorney, Agent, or Firm—Dilworth & Barrese, LLP

(57) ABSTRACT

Novel interconnect structures possessing a relatively low internal stress and dielectric constant for use in semiconductor devices are provided herein. The novel interconnect structures comprise a first layer having a coefficient of thermal expansion greater than about 20 ppm and a first internal stress associated therewith, the first layer having a first set of metallic lines formed therein; a second layer having a coefficient of thermal expansion less than about 20 ppm and a second internal stress associated therewith, the second layer having a second set of metallic lines formed therein; and one or more stress adjustment cap layers formed between the first layer and the second layer, the cap layer(s) having a third internal stress to offset the first stress of the first layer and the second stress of the second layer and inducing a favorable relief of stress on the interconnect structure. Methods for making a semiconductor device having a substantially reduced internal stress are also provided.

22 Claims, 6 Drawing Sheets

INTERCONNECT STRUCTURES CONTAINING STRESS ADJUSTMENT CAP LAYER

BACKGROUND

1. Technical Field

The present invention generally relates to integrated circuits (ICs), and more particularly to interconnect structures, including multilevel interconnect structures, in which the internal stress of the structure is significantly reduced by employing a stress adjustment cap layer. The present invention is also directed to a method of fabricating an interconnect structure having a significantly reduced internal stress.

2. Description of Related Art

Generally, semiconductor devices include a plurality of circuits which form an integrated circuit including chips (e.g., chip back end of line, or "BEOL"), thin film packages and printed circuit boards. Integrated circuits can be useful for computers and electronic equipment and can contain millions of transistors and other circuit elements that are fabricated on a single silicon crystal substrate. For the device to be functional, a complex network of signal paths will normally be routed to connect the circuit elements distributed on the surface of the device. Efficient routing of these signals across the device can become more difficult as the complexity and number of the integrated circuits are increased. Thus, the formation of multi-level or multi-layered interconnection schemes such as, for example, dual damascene wiring structures, have become more desirable due to their efficacy in providing high speed signal routing patterns between large numbers of transistors on a complex semiconductor chip. Within the interconnection structure, metal vias run perpendicular to the silicon substrate and metal lines run parallel to the silicon substrate.

Presently, interconnect structures formed on an integrated circuit chip consists of at least about 2 to 8 wiring levels fabricated at a minimum lithographic feature size designated about 1× (referred to as "thinwires") and above these levels are about 2 to 4 wiring levels fabricated at a width greater than about 1× the minimum width of the of the thinwires. Typically, these larger wires have a width equal to about 2× and/or about 4× the minimum width of the thinwires (referred to as "fatwires"). Fatwires may have any width greater than about 1× the minimum width of the thinwires with 2× and 4× being common examples. In one class of prior art structures, the thinwires are formed in a low dielectric constant (k) organic polymer dielectric layer, and the fatwires are made in a silicon dioxide dielectric layer having a dielectric constant of about 4. See, e.g., Goldblatt, et al., "A High Performance 0.13 $\mu$m Copper BEOL Technology with Low-K Dielectric", Proceedings of IITC, 2000.

However, reliability problems are associated with these prior art structures. For example, these structures are not sufficient to withstand present processing operations including the thermal cycling associated with semiconductor manufacturing. Typically, the semiconductor device is subjected to about 5 to 20 thermal cycles to a temperature of 400–450° C. during manufacture. Also, during operation in the field, the device is further subjected to a large number of thermal cycles to a temperature of about 150° C. The reliability testing of completed IC's commonly includes a "thermal cycle" test in which the part is cycled hundreds of times between a selected low temperature and a selected high temperature. A variety of factors lead to a change in resistance of the metal vias within the interconnect structure when these thermal cycles occurs with the via resistance increasing with repeated thermal cycles. The largest increase in via resistance has been found to occur at the uppermost thinwire layer level below the fatwire layer levels.

Another problem associated with these prior art structures is poor adhesion observed at the location of the interface of the uppermost thinwire level and bottommost fatwire level. Poor adhesion is due to the high stress level of the material in the layers associated with the interface. This phenomenon is known as peeling. The details of this adhesion problem are not yet sufficiently clear or complete to those skilled in the art. It is believed that the problem of poor adhesion exists due to the high stress level of the material in the layers associated with the interface. Each material in these layers exhibits an internal stress, either tensile or compressive, which can eventually cause curving of the layer superimposed on another layer. By convention, tensile stress has a value greater than zero while compressive stress has a value less than zero. If the stress is particularly high so as to generate forces at the interface which are greater than the adhesion forces between the layers, peeling occurs.

It would therefore be desirable to provide an interconnect structure that can provide better adhesion at the interface of the uppermost thinwire and bottommost fatwire levels as well as a relatively low effective capacitance for the device. This allows for electric signals to travel faster therethrough. It would also be desirable for the interconnect structure to possess a substantially low stress level, i.e., one equal to about zero, thereby providing a stable structure when subjected to thermal cycles at both low temperatures, e.g., room temperature, and at high temperatures, e.g., temperatures above about 150° C. It would further be desirable to adjust the stress of the structure to relatively low compressive values (not zero) as needed for specific applications.

SUMMARY

It is therefore an object of the present invention to provide a BEOL interconnect structure of, e.g., the dual damascene type, with a reduced effective capacitance (i.e., low-k) in both the thinwire and fatwire levels.

It is also an object of the present invention to provide a BEOL interconnect structure of, e.g., the dual damascene type, with improved adhesion.

It is a further object of the present invention to provide a BEOL interconnect structure which includes at least a stress adjustment cap layer formed between a first layer having a coefficient of thermal expansion ("CTE") greater than about 20 parts per million ("ppm") and a first internal stress associated therewith and a second layer having a CTE less than about 20 ppm and a second internal stress associated therewith wherein the cap layer possesses an internal stress to offset the first internal stress of the first layer and the second internal stress of the second layer. A cap layer having an adjustable stress state (i.e., tensile vs. compressive) can induce a favorable relief of stress on the interconnect structure, i.e., provides an interconnect structure having a substantially low internal stress, e.g., one possessing an internal stress equal to about zero. In this manner, the interconnect structure has improved stress matching stability during thermal cycling.

In keeping with these and other objects of the present invention, there is provided an interconnect structure comprising a first layer having a CTE greater than about 20 ppm and a first internal stress associated therewith, the first layer having a first set of metallic lines formed therein; a second layer having a CTE less than about 20 ppm and a second internal stress associated therewith, the second layer having a second set of metallic lines formed therein; and a stress adjustment cap layer formed between the first layer and the second layer, the cap layer having a third internal stress to offset the first internal stress associated with the first layer and the second internal stress associated with the second layer and induce a favorable relief of stress on the interconnect structure.

Also in accordance with the present invention, an interconnect structure is provided which comprises one or more levels of a first layer having a CTE greater than about 20 ppm and a first set of metallic lines formed therein; one or more levels of a second layer having a CTE less than about 20 ppm and a second set of metallic lines formed therein wherein the width of each of the metallic lines in the first set is equal to or greater than the width of each of the metallic lines in the second set, and a stress adjustment cap layer formed therebetween.

A method for making an interconnect structure having a substantially reduced internal stress useful in forming a semiconductor device has also been discovered which comprises the steps of:

a) forming one or more levels on at least a portion of an integrated chip, each level comprising a first layer having a CTE greater than about 20 ppm and a first internal stress associated therewith, each first layer having a first set of metallic lines formed therein;

b) forming a stress adjustment cap layer on the first layer of the uppermost layer;

c) forming one or more levels on at least a portion of the cap layer, each level comprising a second layer having a CTE less than about 20 ppm and a second internal stress associated therewith, each second layer having a second set of metallic lines formed therein; wherein the cap layer possesses a third internal stress to offset the first internal stress associated with the first layer and the second internal stress associated with the second layer and induce a favorable relief of stress on the interconnect structure.

BRIEF DESCRIPTION OF THE DRAWINGS

Preferred embodiments of the present disclosure are described below with reference to the drawings, which are described as follows.

DESCRIPTION OF THE PREFERRED EMBODIMENT

Figure 1A:
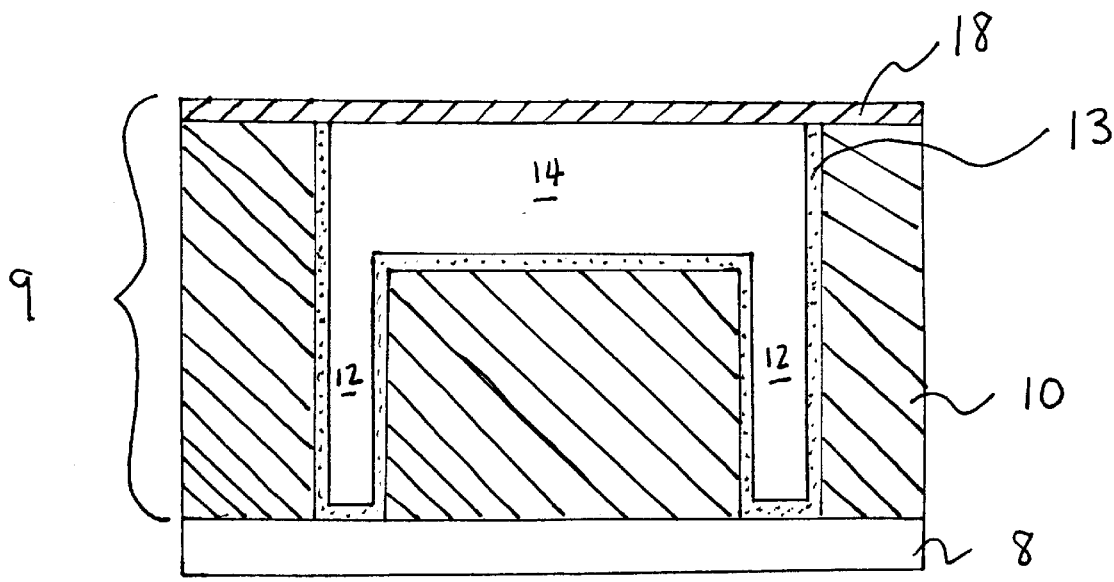
FIG. 1A is a schematic cross-sectional view of an integrated chip containing an interconnect level having a first layer having a set of metallic lines and vias therein and a diffusion barrier layer thereon.

The present invention which is directed to an interconnect structure useful for forming a semiconductor device, the interconnect structure having a substantially reduced internal stress by employing a stress adjustment cap layer between a first layer having a first internal stress associated therewith and a second layer having a second internal stress associated therewith. In general, the first internal stress associated with the first layer is a tensile stress while the second internal stress associated with the second layer is either a tensile stress or a compressive stress, depending on the specific material chosen for the second layer. The interconnect structure of the present invention is based on the surprising discovery that when selecting the particular materials for the first and second layers, the stress of the respective materials will be such that a stress adjustment cap material having a particular stress associated therewith, i.e., tensile or compressive stress, can be selected such that the overall internal stress of the structure will be substantially reduced thereby and inducing a favorable relief of stress on the interconnect structure. The interconnect structure of the present invention will now be described in more detail by referring to the drawings accompanying the present application.

Referring now to FIG. 1A, one such semiconductor device in accordance with the present disclosure can be formed by first providing an integrated circuit structure 8 which is formed in a semiconductor material substrate. The expression "integrated circuit structure" as used herein refers to, for example, an integrated circuit at the end of its formation as is known in the art, i.e., after formation of metallization strips. The substrate may be a semiconductor wafer or chip which is composed of any silicon-containing semiconductor material such as, for example, Si, SiGe, Si/SiGe, Si/SiO$_2$/Si, etc. The substrate may be of the n or p-type depending on the desired device to be fabricated. Moreover, the substrate may contain various isolation and/or device regions either formed in the substrate or on a surface thereof. The substrate may also contain metallic pads on the surface thereof. In addition to silicon-containing semiconductor materials, the substrate may also be a circuit that includes CMOS devices therein.

In general, integrated circuit 8 will have first interconnect level 9 formed thereon by depositing a first layer 10 on at least a portion thereon. The first layer 10 possesses a CTE of greater than about 20 ppm and has a first internal stress associated therewith. Additionally, first layer 10 will have a set of metallic lines 14 formed therein optionally containing a liner material 13. As one skilled in the art will readily appreciate, the internal stress generally associated with a material having a CTE greater than about 20 ppm and useful for the first layer is a tensile stress. The convention typically used is that the value associated with tensile stress is positive, i.e., a value greater than zero, while the value associated with compressive stress is negative, i.e., a value less than zero. In general, the tensile stress will vary according to the specific material chosen for the first layer and typically ranges from about $0.1 \times 10^9$ to about $1.5 \times 10^9$ dynes/cm$^2$ and more preferably from about $0.5 \times 10^9$ to about $1 \times 10^9$ dynes/cm$^2$.

Suitable materials for first layer 10 are low-k organic materials having a tensile stress associated therewith and include any conventional organic non-porous and porous material known to one skilled in the art with a low dielectric constant. It is particularly advantageous to employ porous organic dielectric materials herein since, as one skilled in the art would readily appreciate, these materials will decrease the effective dielectric. constant of the semiconductor device. Preferred organic materials include, but are not limited to, organic thermosets such as, for example, aromatic hydrocarbons such as a commercially available organic thermoset from Dow Chemical Co. sold under the tradename SiLK (which possesses a tensile stress of from about $0.45 \times 10^9$ to about $0.50 \times 10^9$ dynes/cm$^2$); polyimides; polyarylene ethers; benzocyclobutenes and porous forms of these materials; and the like with SiLK or a porous type of SiLK being most preferred for use herein. The organic dielectric materials useful in forming first layer 10 will ordinarily possess a dielectric constant less than about 3 and preferably from about 1.5 to about 2.7. The average pore size and size distribution of these materials will ordinarily range from about 1 to about 50 nm, with less than about 10 nm being preferred.

Techniques and parameters for forming first layer 10 on substrate 8 (e.g., spin coating) are within the purview of one skilled in the art. The first layer 10 having a tensile internal stress can ordinarily be applied on the surface of substrate 8 as a substantially planarized layer. A substantially planarized layer can be achieved either directly through the formation process, e.g., spray, spin-on or other methods known in the art with the spin-on method being preferred or by applying known and conventional procedures, e.g., chemical-mechanical polishing (CMP), once the first layer 10 has been formed to advantageously provide a substantially planarized surface. Typically, the thickness of first layer 10 will range from about 100 to about 600 nm and preferably from about 300 to about 500 nm.

In addition to those elements, first layer 10 can also include metallic filled vias 12 with the metallic lines 14. It is particularly advantageous to create metallic lines and vias that are of a dual damascene wiring interconnect structure for use herein. The metallic lines and vias can be composed of the same or different conductive material. Suitable materials for use herein include, but are not limited to, W, Cu, Al, Ag, Au and alloys thereof and the like. A highly preferred material is Cu. It is also advantageous to form the metallic lines in first layer 10 such that the width (as seen from top, or plan view) is relatively small, i.e., thinwires. The width for the metallic lines 14 will ordinarily range from about 20 nm to about 250 nm and preferably from about 100 to about 180 nm. It is also contemplated that wires of different widths may be formed simultaneously up to about 100 microns in width.

Each of the metallic lines 14 and vias 12 can optionally include a liner material 13 that lines the metallic lines and vias. Suitable materials that can be used as liners include, but are not limited to, TiN, TaN, Ta, WN, W, TaSiN, TiSiN and the like and mixtures thereof. The liner may be composed of a single layer or it may be composed of multiple layers.

Techniques and parameters for forming the metallic lines and vias including the optional liner material that lines the metallic lines and vias in the first layer are within the purview of one skilled in the art. For example, openings for defining lines and vias can be formed utilizing conventional lithography (including applying a photoresist to a surface of the low-k organic dielectric layer) and etching. The etching step includes any conventional dry or wet etching process such as, for example, reactive ion etching, ion beam etching and plasma etching. The photoresist is then stripped from the layer utilizing conventional stripping processes.

Following formation of the openings in the first layer, the exposed surfaces of the openings may be cleaned utilizing any cleaning method well known to those skilled in the art. Next, the optional liner material may be formed on the exposed surfaces of the opening as well as the exposed surfaces of the organic dielectric layer utilizing any conventional deposition process, e.g., evaporation, sputtering, CVD and ALD. The liner typically has a thickness of from about 2 to about 100 nm.

Next, one of the foregoing conductive materials is deposited on the liner, if used, or on the exposed surfaces of the openings and first layer 10 employing conventional deposition processes such as, for example, CVD, plasma-assisted CVD, sputtering, plating, evaporation, or chemical solution deposition. The conductive filled structure is then subjected to a conventional planarization process in which any residual conductive metal and/or liner outside the opening is substantially removed. For example, CMP may be used and after CMP the top horizontal portions of the metallic lines are approximately coplanar with the top surface of the first layer.

A diffusion barrier layer 18 can then be deposited as a continuous layer on the top surface thereof to form interconnect level 9. Diffusion barrier layer 18 is composed of any insulating material which is capable of preventing one of the above mentioned conductive metals from diffusing into the first layers formed above this interconnect level, which is described below. Another important feature of the barrier layer is that it does not affect the resistivity of the metallic lines. Moreover, the barrier layer may serve as an RIE etch stop layer. Suitable materials for forming diffusion barrier layer 18 include, but are not limited to, SiC, SiCH, nitrogen-containing materials such as, for example, $Si_3N_4$, SiON and SiCN, SiCNH, e.g., those nitrogen-containing materials possessing an atomic composition of from about 10 to 40% Si, about 10 to 30% C, about 5 to 30% N, and about 20 to 50% H, and the like. Techniques and parameters for depositing barrier layer 18 are within the purview of one skilled in the art.

Figure 1B:
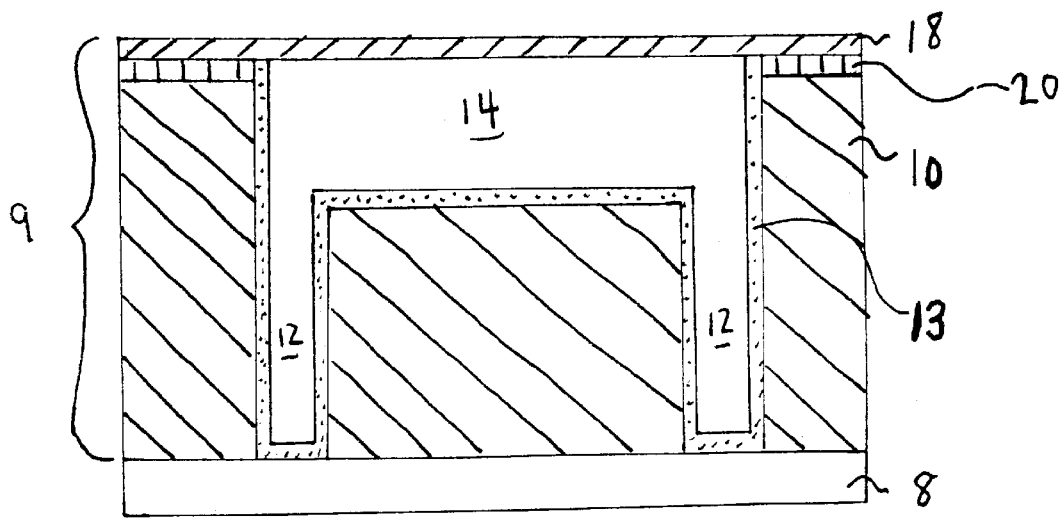
FIG. 1B is a schematic cross-sectional view of an alternative embodiment of the integrated chip containing the interconnect level of FIG. 1A with a hard masking cap layer such that the top horizontal portions of the metallic lines and vias are coplanar with the top surface of the hard masking cap.

In an alternate embodiment, a hard masking CMP stop layer 20 such as, for example, a material formed from SiCH, α-SiCH, SiCOH, $SiO_2$ or SiN, may be formed on the organic dielectric layer prior to forming metallic lines and vias therein as generally depicted in FIG. 1B. Techniques and parameters for depositing hard masking CMP stop layer 20 are within the purview of one skilled in the art, e.g., utilizing conventional deposition processes. The CMP stop layer aids in patterning in the presence of resist erosion and aids in improving the resistance to erosion of the first layer during metal CMP. The additional hard masking CMP stop is optionally, but not necessarily, fully or partially removed after the first layer has been patterned and etched or after metal fill polishing. When a hard masking cap material is present in interconnect level 9, the top horizontal portion of the metallic lines are coplanar with a top surface of the hard masking cap layer (see FIG. 1B).

Figure 2:
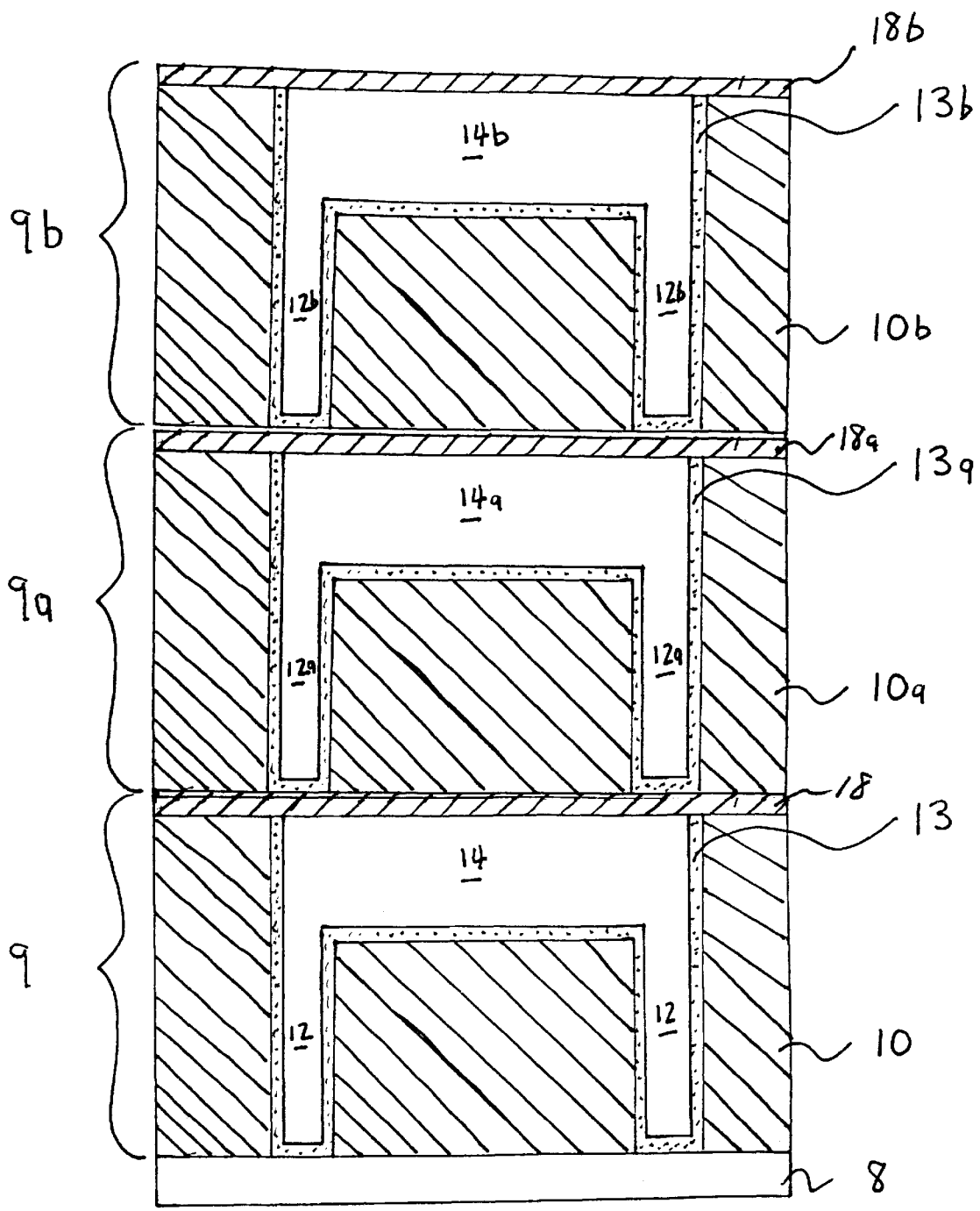
FIG. 2 is a schematic cross-section view of a multi interconnect level of level of FIG. 1A.

The above processing steps for forming a damascene structure including deposition of the first layer, patterning and etching the first layer, conductive fill and planarization, may be repeated any number of times to provide a multi interconnect level structure as generally depicted in FIG. 2. As shown in FIG. 2, a plurality of interconnect levels 9, 9a and 9b each having a first layer 10, 10a and 10b and a set of metallic lines 14, 14a and 14b therein, respectively, with vias 12, 12a and 12b, respectively, are formed to provide the multilevel structure. Each level is formed according to the above description and is comprised of the elements disclosed above. The number of levels that can be formed ranges, for example, from about 2 to about 10 levels.

Figure 3:
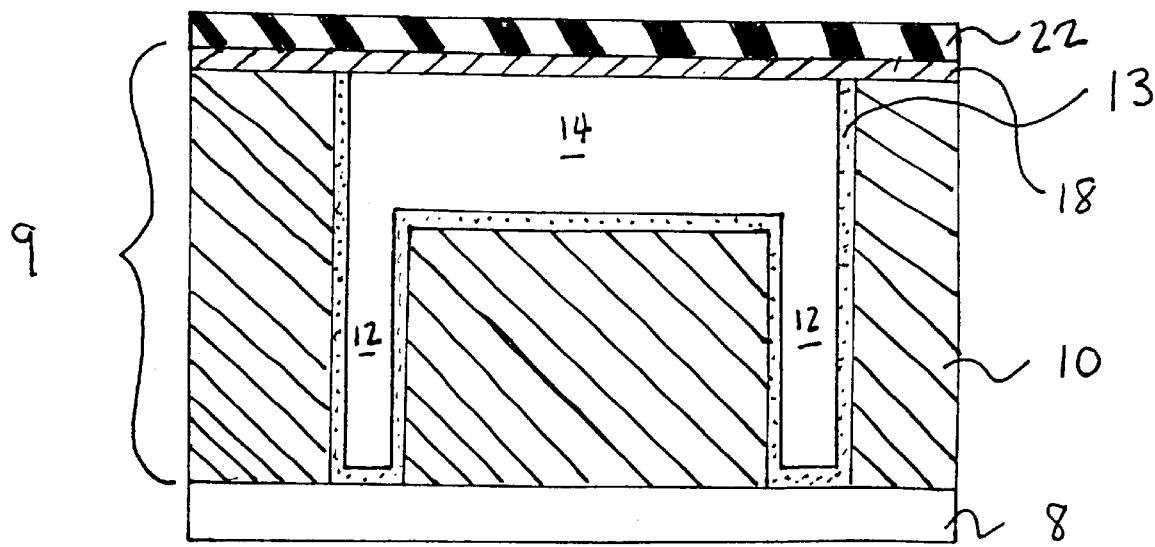
FIG. 3 is a schematic cross-sectional view of the multi interconnect level of FIG. 2 with a cap layer thereon.

Next, one or more of the same or different stress adjustment cap materials are deposited on layer 18 as a continuous layer 22 as generally depicted in FIG. 3. Layer 22 is typically deposited on layer 18 of the uppermost interconnect level. The stress adjustment cap material(s) used for forming cap layer 22 advantageously possesses an internal stress to offset the first stress associated with first layer 10 and the second stress associated with the second layer which is discussed hereinbelow. In this manner, the stress adjustment cap material(s) advantageously induces a favorable relief of stress on the interconnect structure, e.g., by substantially reducing the internal stress of the structure to a level of less than about $-2\times10^9$ dynes/cm$^2$ and preferably to a stress level of about zero (0). As discussed hereinabove, in order to reduce the stress of the structure to provide such relief, one or more cap materials for forming one or more cap layers each having a tensile stress or a compressive stress are selected, depending on the particular materials selected for the first and second layers. Additionally, the cap materials used for the cap layer(s) advantageously possess barrier properties such that the cap material is capable of preventing one of the above mentioned conductive metals from diffusing into the material of the second layers formed above the cap layer, which is discussed hereinbelow.

Suitable materials for forming cap layer(s) include, for example, those materials having a compressive stress formed from a composition containing at least Si, C, N and H and optionally O. Other materials suitable for forming cap layer 22 and having a compressive stress include, but are not limited to, silicon nitride from high density plasma (HDP), silicon nitride from low density plasma (PE CVD tool), very thin silicon nitride from high density plasma and the like. Suitable materials for cap layer 22 having a tensile stress associated therewith are those formed from a composition containing at least Si, C and H. Examples of the compressive and tensile stress' of the materials for cap layer 22 are set forth in Table 1 below.

TABLE 1

Intrinsic Stress of Cap Layer Materials

| Material | Room T Stress |
|---|---|
| SiCH | about 0.5 to about 2.0 × 10$^9$ dynes/cm$^2$ Tensile Stress |
| SiCNH | about −1 to about −2 × 10$^9$ dynes/cm$^2$ Compressive Stress |
| SiNitride from high density plasma (HDP) (typical) | about −2.0 × 10$^9$ dynes/cm$^2$ Compressive Stress |
| Very Thin SiNitride from high density plasma (HDP) | about −12 × 10$^9$ dynes/cm$^2$ Compressive Stress |
| SiNitride from low density plasma (PE CVD tool) | about −2.0 to about −4.0 × 10$^9$ dynes/cm$^2$ Compressive Stress |

Preferred materials for cap layer 22 are those formed from SiCNH in which the atomic composition comprises from about 10 to about 40% Si, about 10 to about 30% C, about 5 to about 30% N, and about 20 to about 50% H with O being present in relatively small amounts, e.g., amounts less than about 0.5%. A particularly preferred composition is one in which the atomic composition is about 26% Si, about 18% C, about 19% N and about 37% H. Techniques for deposiusing cap layer 22 are within the purview of one skilled in the art, e.g., plasma enhancement chemical vapor deposition (PE CVD). The thickness of cap layer 22 will ordinarily range from about 10 to about 100 nm and preferably from about 20 to about 80 nm.

In general, it is particularly advantageous to select the materials for forming stress adjustment cap layer(s) such that the stress matching of these layers substantially reduces the stress of the interconnect structure in accordance with the following Equation I:

$$t_1 Sc_1 + t_2 Sc_2 + t_3 Ss_1 + t_4 Ss_2 = 0 \quad (I)$$

wherein $t_1$ is the thickness of the first cap layer, $Sc_1$ is the stress associated with the first cap layer, $t_2$ is the thickness of the second cap layer, $Sc_2$ is the stress associated with the first cap layer, $t_3$ is the thickness of the first layer, $Ss_1$ is the stress associated with the first layer, $t_4$ is the thickness of the second layer and $Ss_2$ is the stress associated with the second layer. For example, in the case where the stress value for each of the first and second layer is such that the values of $t_3 Ss_1$ and $t_4 Ss_2$ add up to greater than zero (i.e., where both materials for first and second layers produce a tensile stress) then the stress values for the materials for the first and second cap layers are such that values of $t_1 Sc_1$ and $t_2 Sc_2$ add up to less than zero (i.e., where the cap materials produce a compressive stress). In this manner, the overall stress of the interconnect structure will be substantially reduced by being as close to zero as possible. As one skilled in the art will readily appreciate, the stress value of the overall structure will be as close to zero as possible. Accordingly, the interconnect structure will be able to withstand thermal cycling at high temperatures, e.g., those temperatures up to about 400 to about 450° C.

Figure 4A:
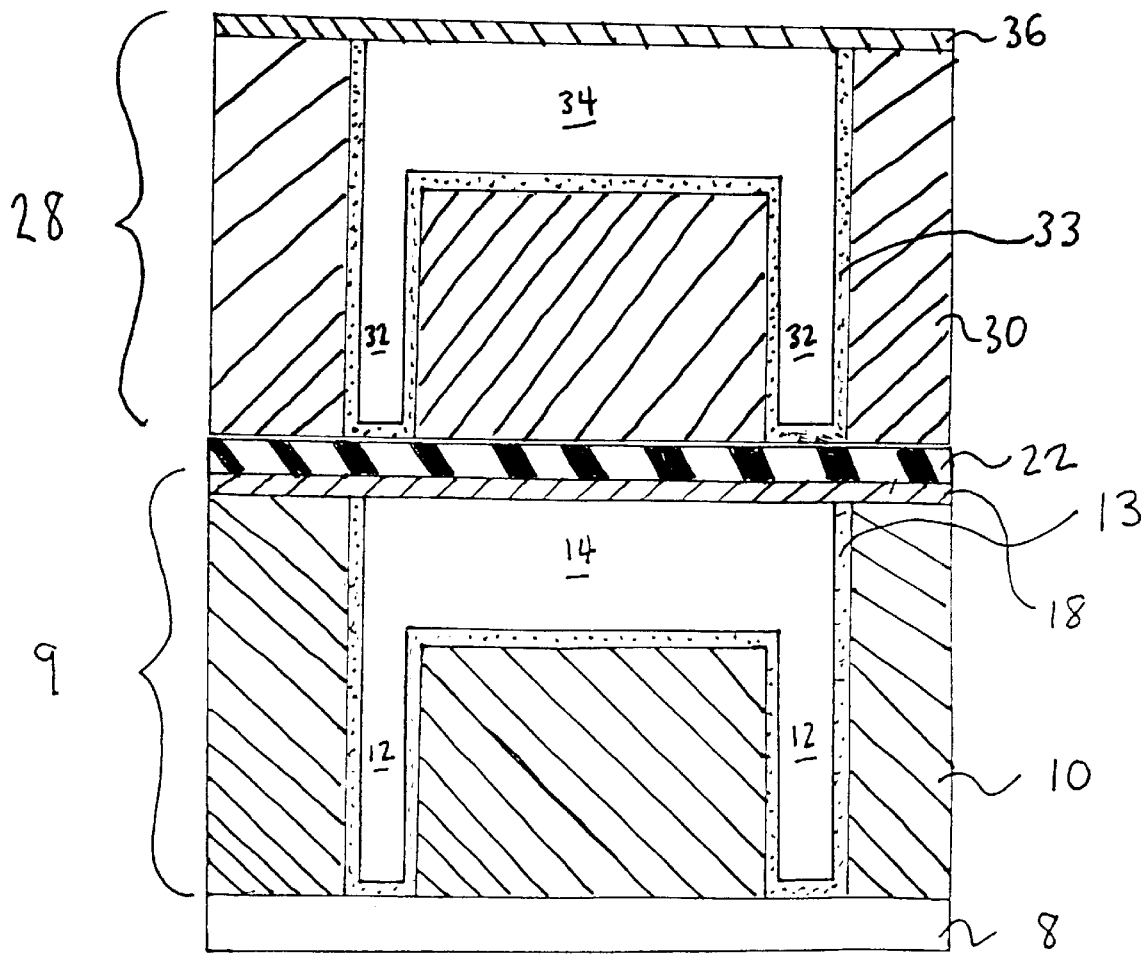
FIG. 4A is a schematic cross-sectional view of the structure of FIG. 3 containing an interconnect level formed on the cap layer, the interconnect level having a second layer having a set of metallic lines and vias therein.

Next, an interconnect level 28 containing at least a second layer having a set of metallic lines 34 and vias 32 formed therein optionally containing liner material 33 is formed as generally depicted in FIG. 4A. In general, interconnect level 28 is formed by first depositing second layer 30 on at least a portion of the top surface of cap layer 22. The second layer 30 possesses a CTE of less than about 20 ppm and has a second internal stress associated therewith. As one skilled in the art will readily appreciate, the internal stress generally associated with a material having a CTE less than about 20 ppm and useful for the second layer 30 is a tensile or compressive internal stress. In generally, the internal stress of the second layer will vary according to the specific material chosen for the second layer. The internal stress of the second layer typically ranges from about $-2\times10^9$ dynes/cm$^2$ to about $+1\times10^9$ dynes/cm$^2$ and more preferably from about $-1\times10^9$ dynes/cm$^2$ to about $+0.7\times10^9$ dynes/cm$^2$.

Suitable materials for second layer 30 are low-k inorganic materials and include any conventional inorganic non-porous and porous material known to one skilled in the art with a low dielectric constant. It is particularly advantageous to employ porous inorganic dielectric materials herein since, as one skilled in the art would appreciate, these materials will decrease the effective dielectric constant of the semiconductor device.

Preferred inorganic materials include, but are not limited to, silicon-containing materials such as compositions formed from one or more of Si, C, O, F and H, e.g., FSG, C doped oxide, F doped oxide, alloys of Si, C, O and H, and the like. Specific examples include, but are not limited to, Black Diamond from Applied Materials, Coral from Novellus Systems, and a variety of spin applied films based on hydrogen silsesquioxane (HSQ), methyl silsesquioxane (MSQ), phenyl silsesquioxane and the like. Examples of the ranges of the internal stress associated with the inorganic materials are set forth below in Table 2.

TABLE 2

Intrinsic Stress of some low-k inorganic dielectrics

| Material | Room T Stress |
| --- | --- |
| SiCOH Inorganic | about 0.2 to about 0.7 × $10^9$ dynes/cm2 Tensile Stress |
| Black Diamond from Applied Materials Inorganic | about 0.50 to about 1.0 × $10^9$ dynes/cm2 Tensile Stress |
| Coral from Novellus Inorganic | about 0.2 to about 0.7 × $10^9$ dynes/cm2 Tensile Stress |

A particularly preferred inorganic material for second layer 30 is a composition of SiCOH in which the atomic composition comprises from about 10 to 30% Si, about 10 to 40% C, about 10 to 45% O, and about 25 to 55% H and preferably from about 15 to 25% Si, about 12 to 25% C, about 15 to 35% O and about 30 to 50% H. The inorganic dielectric materials useful in forming second layer 30 will ordinarily possess a dielectric constant less than about 3.5 and preferably from about 2.7 to about 3.3.

Techniques and parameters for depositing second layer 30 are within the purview of one skilled in the art, e.g., by PECVD from a cyclic precursor as disclosed in U.S. Pat. No. 6,147,009, the contents of which are incorporated by reference herein. The second layer 30 can ordinarily be applied on the surface of cap layer 22 as a substantially planarized layer. As discussed above with respect to first layer 10, a substantially planarized layer 30 can be achieved either directly through the formation process, e.g., in the case of a chemical vapor deposition or spin on technique, or by applying known and conventional procedures, e.g., chemical-mechanical polishing (CMP), once the layer 30 has been formed to advantageously provide a substantially planarized surface. Typically, the thickness of layer 30 will range from about 100 to about 600 nm and preferably from about 100 to about 300 nm.

In addition to those elements, layer 30 can also include metallic filled vias 32 with the metallic lines 34. As is the case with the metallic lines and vias formed in the first layer 10, it is also particularly advantageous to create metallic lines and vias in the second layer 30 that are of a dual damascene (via plus next level conductor) wiring interconnect structure for use herein. The metallic lines and vias are composed of the same or different conductive material. Suitable materials for use herein include, but are not limited to, W, Cu, Al, Ag, Au and alloys thereof and the like. A highly preferred material is Cu. It is also advantageous to form metallic lines 34 that have a thickness which is equal to or greater than the thickness of the metallic lines 14 in first layer 10. Metallic lines 34 will ordinarily have a width which is n times the width of metallic lines 14 wherein n is greater than about 1, preferably an integer ranging from about 1 to about 10 and most preferably from about 2 to about 4. As width is increased by n, thickness is also greater, but not by a simple integer value.

Each of metallic lines 34 and vias 32 can optionally include a liner material 33 that lines the metallic lines and vias. Suitable materials that can be used as liners include, but are not limited to, TiN, TaN, Ta, WN, W, TaSiN, TiSiN and the like and mixtures thereof. The liner may be composed of a single layer or it may be composed of multiple layers.

Techniques and parameters for forming metallic lines 34 and vias 32 including optional liner material 33 that lines the metallic lines and vias in second layer 30 are generally the same as those discussed with respect to the metallic lines and vias formed in first layer 10. Once second layer 30 with metallic lines and vias therein has been formed, the structure can then be subjected to a conventional planarization process in which any residual conductive metal and/or liner outside the opening is substantially removed, e.g., utilizing a CMP process such that the top horizontal portions of the metallic lines are coplanar with the top surface of the second layer.

A diffusion barrier layer 36 can then be deposited on the top surface thereof to form interconnect level 28. Diffusion barrier layer 36 is composed of any insulating material which is capable of preventing one of the above mentioned conductive metals from diffusing into the dielectric layers formed above this interconnect level, which is described below. Barrier layer 36 may also serve as an RIE etch stop layer. Suitable materials and techniques and parameters for forming diffusion barrier layer 36 can any of those used with respect to barrier layer 18.

Figure 4B:
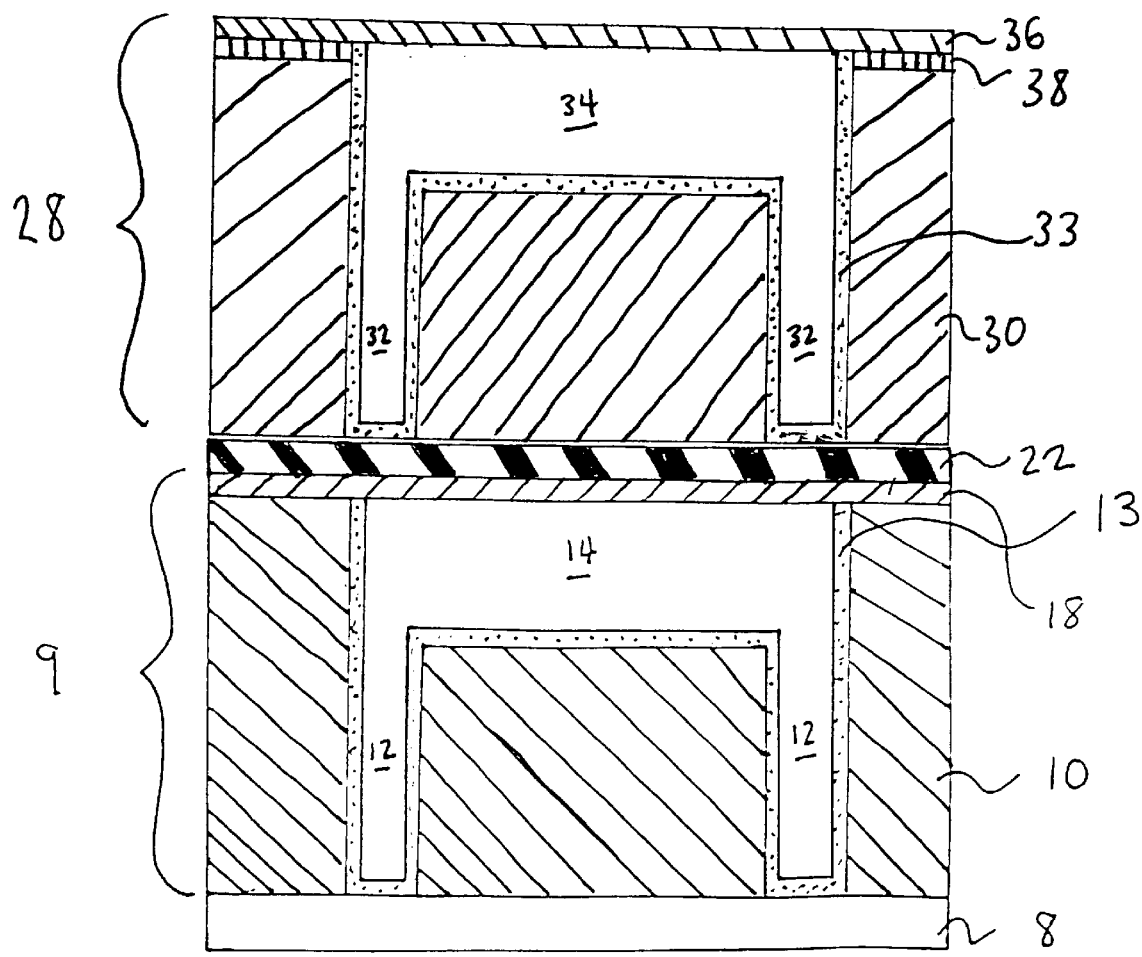
FIG. 4B is a schematic cross-sectional view of an alternative embodiment of the integrated chip containing the interconnect level of FIG. 4A with a hard masking cap layer such that the top horizontal portions of the metallic lines and vias are coplanar with the top surface of the hard masking cap.

In an alternate embodiment, a hard masking layer 38 such as, for example, a material formed from $SiO_2$, SiCH or SiN, may be formed on inorganic dielectric layer 30 prior to forming metallic lines and vias therein as generally depicted in FIG. 4B. Techniques and parameters for depositing hard masking layer 38 are within the purview of one skilled in the art. The hard masking layer aids in patterning as well as in improving the resistance to erosion of the dielectric layer during metal CMP. The additional hard masking layer is typically, but not necessarily, fully or partially removed after metal fill polishing during CMP. When a hard masking material is present in interconnect level 28, the top horizontal portion of the metallic lines are coplanar with a top surface of the hard masking layer (see FIG. 4B).

Figure 5:
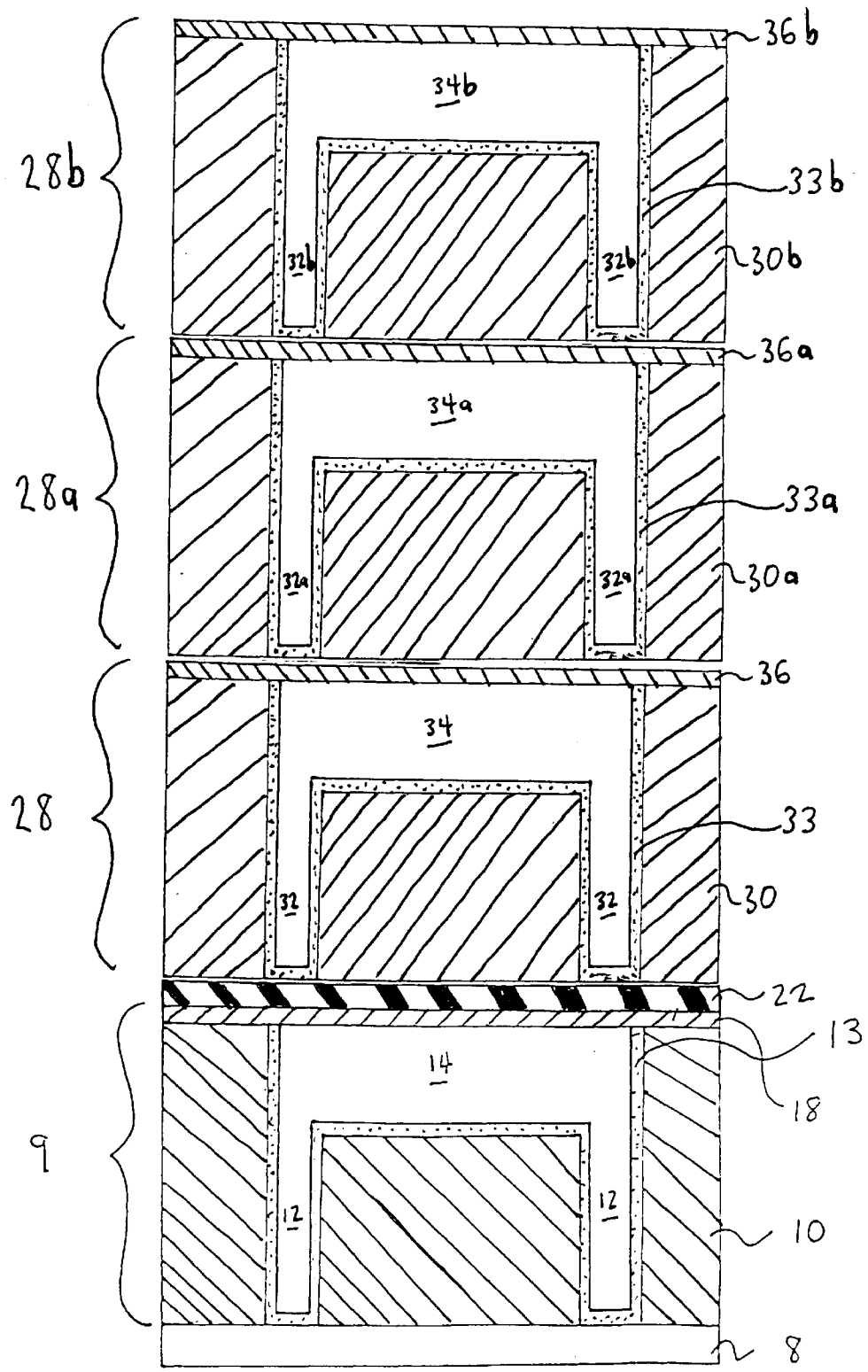
FIG. 5 is a schematic cross-sectional view of a multi interconnect level of the level of FIG. 4A.

The above processing steps for forming a damascene structure including deposition of the second layer, patterning and etching the second layer, conductive fill and planarization, may be repeated any number of times to provide a multi interconnect level structure as generally depicted in FIG. 5. As shown in FIG. 5, a plurality of interconnect levels 28, 28a and 28b each having a second layer 30, 30a and 30b and a set of metallic lines 34, 34a and 34b therein, respectively, with vias 32, 32a and 32b, respectively, are formed to provide the multilevel structure. Each level is formed according to the above description and is comprised of the elements disclosed above. The number of levels that can be formed ranges, for example, from about 2 to about 10 levels.

Although the invention has been described in its preferred form with a certain degree of particularity, obviously many changes and variations are possible therein and will be apparent to those skilled in the art after reading the foregoing description. For example, additional layers known in the art can be formed on the top of interconnect level 28. It is therefore to be understood that the present invention may be presented otherwise than as specifically described herein without departing from the spirit and scope thereof.

What is claimed is:

1. An interconnect structure comprising:
   one or more first interconnect levels, one on top of each other, each level comprising a first layer having a coefficient of thermal expansion (CTE) greater than about 20 parts per million (ppm) and a first internal stress associated therewith, the first layer having a first set of metallic lines formed therein;
   one or more second interconnect levels, one on top of each other, each level comprising a second layer having a CTE less than about 20 ppm and a second internal stress associated therewith, the second layer having a second set of metallic lines formed therein; and one or more stress adjustment cap layers formed between the first layer and the second layer, the cap layer having a third internal stress selected to offset the first internal stress of the first layer and the second internal stress of the second layer and induce a favorable relief of stress on the interconnect structure.

2. The interconnect structure of claim 1 wherein the first layer comprises a non-porous or porous low-k organic dielectric material having a dielectric constant less than about three and selected from the group consisting of organic thermoset polymers, polyimides, polyarylene ethers, benzocyclobutenes and combinations thereof.

3. The interconnect structure of claim 2 wherein the porous material is a polyarylene ether.

4. The interconnect structure of claim 1 wherein the second layer comprises a low-k inorganic dielectric material of Si, C, O and H and having a dielectric constant less than about 3.5.

5. The interconnect structure of claim 1 wherein the second layer comprises a low-k inorganic dielectric material of Si, C, O, H and F and having a dielectric constant less than about 3.5.

6. The interconnect structure of claim 4 wherein the atomic composition of the inorganic dielectric material is about 10 to about 30% Si, about 10 to about 40% C, about 10 to about 45% O, and about 25 to about 55% H.

7. The interconnect structure of claim 4 wherein the atomic composition of the inorganic dielectric material is about 15 to about 25% Si, about 12 to about 25% C, about 15 to about 35% O and about 30 to about 50% H.

8. The interconnect structure of claim 1 wherein the second layer comprises a material of Si, C, O and H and the first layer comprises an organic thermoset polymer.

9. The interconnect structure of claim 1 wherein the first stress of the first layer is a tensile stress and the second stress of second layer is a compressive stress.

10. The interconnect structure of claim 1 wherein the first stress of the first layer is a tensile stress and the second stress of second layer is a tensile stress.

11. The interconnect structure of claim 10 wherein the cap layer is a material comprising Si, C, N and H, and having a compressive stress.

12. The interconnect structure of claim 11 wherein the material comprising Si, C, N and H possesses an atomic composition of about 10 to about 40% Si, about 10 to about 30% C, about 5 to about 30% N, and about 20 to about 50% H.

13. The interconnect structure of claim 1 further comprising a first diffusion barrier layer on the first layer and a second diffusion barrier layer on the second layer.

14. The interconnect structure of claim 13 wherein the first and second diffusion barrier layers are formed of the same or different material.

15. The interconnect structure of claim 14 wherein the diffusion barrier layer is formed from a material selected from the group consisting of $Si_3N_4$, SiON, SiC, SiCH, SiCNH and SiCN.

16. The interconnect structure of claim 1 wherein the metallic lines are composed of the same or different conductive material.

17. The interconnect structure of claim 16 wherein the conductive material is W, Cu, Al, Ag, Au or alloys thereof.

18. The interconnect structure of claim 16 wherein the second set of metallic lines has a width of nx the width of the first set of metallic lines wherein n is greater than about 1.

19. The interconnect structure of claim 1 wherein the first interconnect level is formed on a surface of a silicon-containing substrate or a chip.

20. The interconnect structure of claim 1 further comprising a liner formed in the first and second metallic lines.

21. The interconnect structure of claim 20 wherein the liner is composed of TiN, TaN, Ta, WN, W, TaSiN, TiSiN or mixtures and multi-layers thereof.

22. The interconnect structure of claim 1 comprising two of the same or different stress adjustment cap layers such that the stress of the interconnect structure is equal to about zero and satisfies the following Equation (I):

$$t_1 Sc_1 + t_2 Sc_2 + t_3 Ss_1 + t_4 Ss_2 = 0 \tag{I}$$

wherein $t_1$ is the thickness of the first cap layer, $Sc_1$ is the stress associated with the first cap layer, $t_2$ is the thickness of the second cap layer, $Sc_2$ is the stress associated with the first cap layer, $t_3$ is the thickness of the first layer, $Ss_1$ is the stress associated with the first layer, $t_4$ is the thickness of the second layer and $Ss_2$ is the stress associated with the second layer.

* * * * *